United States Patent [19]

Schutten et al.

[11] Patent Number: 4,542,396
[45] Date of Patent: Sep. 17, 1985

[54] TRAPPED CHARGE BIDIRECTIONAL POWER FET

[75] Inventors: Herman P. Schutten, Milwaukee; James A. Benjamin, Waukesha, both of Wis.; Robert W. Lade, Fort Myers, Fla.

[73] Assignee: Eaton Corporation, Cleveland, Ohio

[21] Appl. No.: 421,930

[22] Filed: Sep. 23, 1982

[51] Int. Cl.$^4$ .................. H01L 29/78; H01L 29/747
[52] U.S. Cl. .................. 357/23.4; 357/23.5; 357/23.8; 357/39
[58] Field of Search ....... 357/23 VT, 23 VD, 23 HV, 357/39, 41

[56] References Cited

U.S. PATENT DOCUMENTS

| | | | |
|---|---|---|---|
| 3,629,667 | 12/1971 | Lubart et al. | 357/51 |
| 4,163,988 | 8/1979 | Yeh et al. | 357/23.4 |
| 4,199,774 | 4/1980 | Plummer | 357/35 |
| 4,243,997 | 1/1981 | Natori et al. | 357/23.4 |
| 4,288,801 | 9/1981 | Ronen | 357/41 |
| 4,364,073 | 12/1982 | Becke | 357/23.4 |
| 4,364,074 | 12/1982 | Garnache et al. | 357/23 |
| 4,414,560 | 11/1983 | Lidow | 357/23.4 |
| 4,455,740 | 6/1984 | Iwai | 357/23 |

OTHER PUBLICATIONS

P. Ou-Yang, "Double Ion-Implantation V-MOS Tech.," J. of S-S Ckts., vol. SC-12 #1, Feb. 1977, pp. 3-10.
H. Lee et al., "Short-Channel Field-Effect Transistors in V-Grooves", IBM Tech. Discl. Bulletin, vol. 22, #8B, Jan. 1982, pp. 3630-3634.
C. Andre T. Salama, "Nonplanar Power Field-Effect Transistors," IEEE Transactions on Electron Devices, vol. ED-25, No. 10, Oct. 1978, pp. 1222-1228.
C. Hu, "A Parametric Study of Power MOSFETs", IEEE Electron Device Conference, Technical Digest, 3-1979, pp. 385-395.
IEEE Transactions Electron Devices, vol. ED-25, No. 10, Oct. 1978.
Ammar & Rogers, "UMOS Transistors on Silicon", IEEE Transactions Electron Dev., Ed-27, pp. 907-914, May 1980.

Primary Examiner—William D. Larkins
Assistant Examiner—Eric Fallick
Attorney, Agent, or Firm—Andrus, Sceales, Starke & Sawall

[57] ABSTRACT

Lateral FET structure is disclosed for bidirectional power switching, including AC application. A plurality of integrated FETs each have left and right source regions and left and right channel regions with a common drift region therebetween, and conduct current in either direction according to the polarity of main terminals. Gating means includes gate electrode means disposed proximate and insulated from the channel regions and adapted for storing trapped charge tunneled through an insulated layer from a charging electrode.

20 Claims, 4 Drawing Figures

TRAPPED CHARGE BIDIRECTIONAL POWER FET

TECHNICAL FIELD

The invention relates to power switching semiconductors, and more particularly to power MOSFETs (metal oxide semiconductor field effect transistors), and the like.

BACKGROUND AND SUMMARY

The invention provides improved lateral FET structure for bidirectional power switching, including AC application. The invention particularly provides enhanced gating capability by means of trapped charge on floating gate electrode means proximate and insulated from a pair of FET channels each conducting current in both directions.

Copending application Ser. Nos. 390,719 and 390,479, filed June 21, 1982, disclose AC power FET structure including laterally spaced source regions and channel regions having a common drift region therebetween. Upon application of voltage of either polarity across main terminals connected to the source regions, current flow in either direction is controlled by the potential on gate electrode means proximate the channels. The potential of the gate electrode means produces electric fields of sufficient intensity to invert the conductivity type in the channel regions, enabling bidirectional conduction.

A need has arisen in some implementations for producing electric fields from the gate electrode means without having to reference the latter to one of the main AC line terminals when applying gate potential. The present invention addresses and satisfies this need by storing trapped charge on electrically isolated gate electrode means. Charging electrode means is disposed proximate the gate electrode means for charging the latter. Electrical insulation layer means is between the gate electrode means and the first and second channel regions. Electrical insulation layer means is also between the charging electrode means and the gate electrode means, with the latter being charged by carriers tunneling through the last mentioned insulation layer means in response to given polarity potential on the charging electrode means.

The AC power FET has an OFF state in the absence of stored trapped charge on the gate electrode means, with the junction between the drift region and one of the channel regions blocking current flow toward one of the source regions, and with the junction between the drift region and the other of the channel regions blocking current flow toward the other of the source regions. Charge is depleted from the gate electrode means by tunneling back through the last mentioned insulation layer means in response to opposite polarity potential on the charging electrode means.

DETAILED DESCRIPTION

Figure 1:
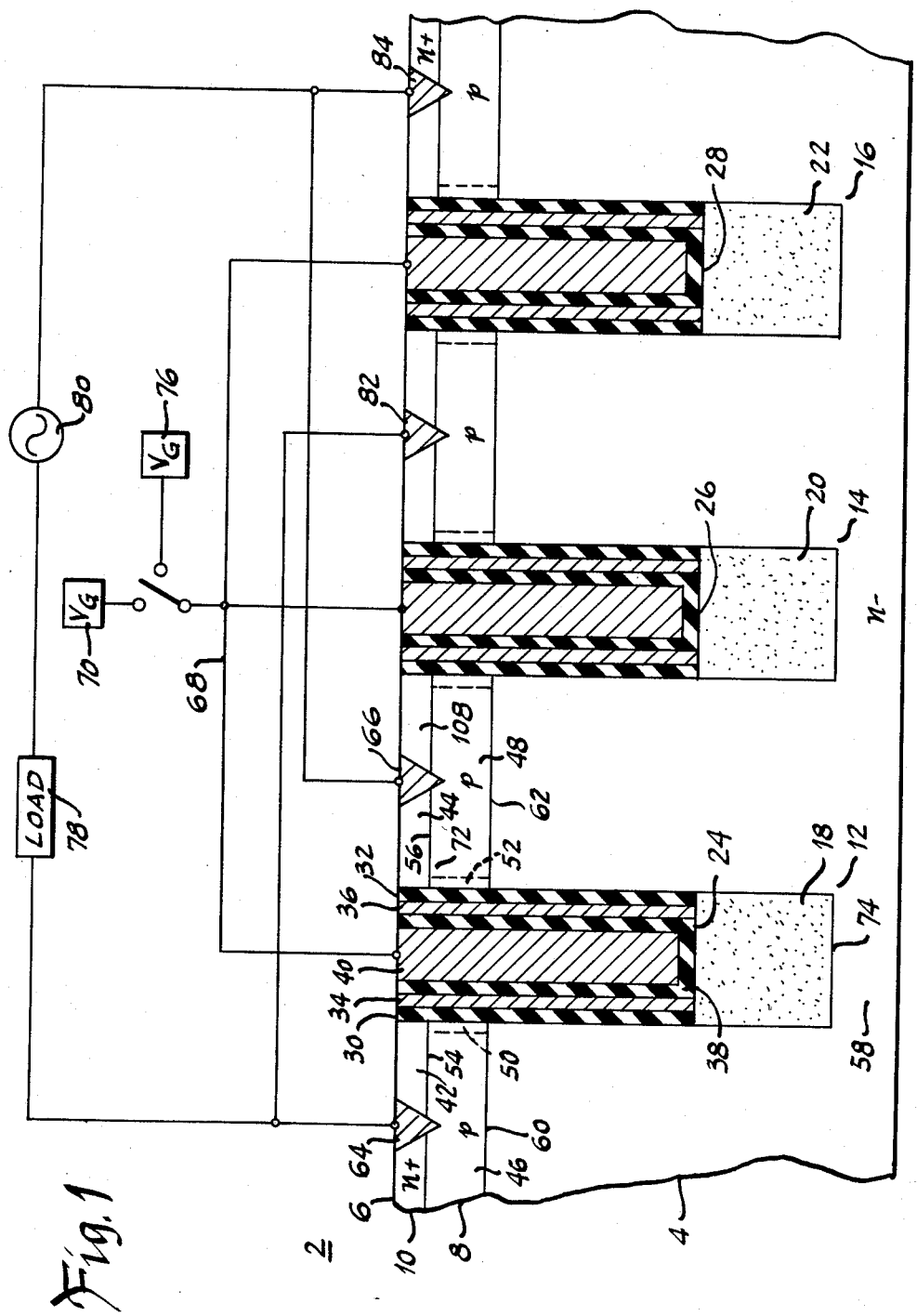
FIG. 1 is a schematic sectional view of AC power FET structure constructed in accordance with the invention.

FIG. 1 shows lateral bidirectional power FET structure 2 including a substrate 4 of one conductivity type, such as n type, having a top major surface 6. A top p layer 8 is diffused or grown into the substrate from top major surface 6, followed by ion implantation and/or diffusion of an n+ top layer 10.

A plurality of notches 12, 14, 16 and so on, are formed in the substrate from top major surface 6 through n+ top layer 10 and through p top layer 8 into substrate region 4. These notches may be anisotropically etched, as known in the art: C. Hu, "A Parametric Study of Power MOSFETs", IEEE Electron Device Conference, 1979, pp. 385-395; IEEE Transactions Electron Devices, Vol. ED-25, No. 10, October, 1978; and Ammar and Rogers, "UMOS Transistors on Silicon", IEEE Transactions on Electron Devices, ED-27, pages 907-914, May 1980. Alternatively, the notches may be formed by a porous silicon region in accordance with the known anodization technique of passing a fixed current through the localized region in the presence of concentrated hydrogen fluoride to create a structural change in the silicon which remains single crystalline with the substrate but becomes porous. In the case of anisotropic etching, the bottom of the notch is filled with insulative material. In the case of anodization, the subbstrate is subjected to an oxidizing atmosphere such that the oxygen enters the pores in the porous notched regions and rapidly oxidizes these regions as shown at 18, 20, 22 and so on, which regions are still single crystalline with substrate 4 but substantially nonconductive. Before or after the anodization, the notches are etched down to levels 24, 26, 28 and so on.

In notch 12, silicon dioxide insulating layers 30 and 32 are grown along the inner opposing facing surfaces of the notch. First and second gate electrodes 34 and 36 are then formed along the left and right vertical sides of the notch, as by shadow evaporation of conductive material such as aluminum from an angle or low pressure chemical vapor deposition (LPCVD) of polysilicon. Another insulating oxide layer 38 is provided along the facing sides of the gate electrodes and along the bottom of the upper notch section, as by chemical vapor deposition. A charging electrode 40 is then deposited in the notch and is insulated between the gate electrodes by insulating layer 38. The gating means, including the gate electrodes and the charging electrode, in notches 14 and 16 is comparable.

Notch 12 extends from top major surface 6 downwardly through top layers 10 and 8 into substrate region 4. Notch 12 separates top layer 10 into first and second left and right source regions 42 and 44 and extends therebetween. Notch 12 separates top layer 8 into first and second regions 46 and 48 containing left and right channel regions 50 and 52 and extends therebetween. Junction 54 is formed between left source 42 and left channel region 50. Junction 56 is formed between right source region 44 and right channel region 52. The substrate 4 around the notch forms a drain or drift region 58 of the substrate. Junction 60 is formed between drift region 58 and region 46 containing left channel region 50. Junction 62 is formed between drift region 58 and region 48 containing right channel region 52. Main electrode metalization 64 is deposited on top major surface 6 in an etched groove to ohmically contact source region 42 and channel containing region 46. Another main electrode metalization 66 is deposited on top major surface 6 in an etched groove to ohmically contact source region 44 and channel containing region 48.

Upon application of given polarity potential to charging electrode 40 via terminal 68 from a voltage source 70, carriers tunnel through insulation layer 38 to left gate electrode 34 to charge the latter. Left gate electrode 34 is electrically floating, and the charge is trapped and stored thereon. When left gate electrode 34 is charged positively with respect to left main electrode 64, electrons in p region 46 are attracted to channel region 50 to invert the conductivity type therein to n type. This allows electron flow from n+ source region 42 through channel 50 into drift region 58 in substrate 4. If right main electrode 66 is positive with respect to left main electrode 64, current may then flow from p region 48 momentarily across forward biased PN junction 62 into drift region 58, then through left channel 50 to source region 42 and left main electrode 64.

As soon as current starts to flow through the FET, the voltage across main electrodes 66 and 64 starts to drop, which in turn reduces the potential in various regions of the FET, including portion 72 of p layer region 48 adjacent the right FET channel 52. This falling potential causes carrier electron flow into right channel region 52 because portion 72 becomes negative relative to right gate electrode 36, whereby electrons are attracted into right channel region 52 to invert the conductivity thereof to n type, and hence render channel 52 conductive. Forward biased PN junction 62 conducts only momentarily until the second channel 52 turns ON.

The main current path through FET 2 is from right main electrode 66 through right source region 44, downwardly through right vertical channel region 52 along the right side of notch 12, then further downwardly into drift region 58 along the right side of the notch, then around the bottom end 74 of notch 12, then upwardly along the left side of notch 12 in drift region 58 of substrate 4, then upwardly through left vertical channel region 50 along the left side of the notch, then through left source region 42 to left main electrode 64.

The structure is bidirectional, and thus current may also flow from left main electrode 64 to right main electrode 66 when the right floating gate electrode 36 has a trapped positive charge with respect to right main electrode 66. Electrons in p layer region 48 are attracted into right channel region 52 by right gate electrode 36 to thus invert channel region 52 to n type and hence allow electron flow from n+ source region 44 through channel 52 into drift region 58 in substrate 4. If left main electrode 64 is positive with respect to right main electrode 66, current then flows from p layer region 46 momentarily across forward biased PN junction 60 until channel 50 turns on. The main current path is from left main electrode 64 through left source 42, through left channel 50, through drift region 58, through right channel 52, through right source 44 to right main electrode 66. Main electrode 66 thus serves as an electron current source when a negative voltage is applied thereto relative to the voltage on main electrode 64, and serves as an anode when a positive voltage is applied thereto relative to the voltage on main electrode 64.

The stored trapped charge on floating gate electrodes 34 and 36 is depleted by carrier tunneling back through insulation layer 38 in response to opposite polarity potential on charging electrode 40 as biased by voltage source 76. In the absence of trapped charge on gate electrodes 34 and 36, or for insufficient charge, channel regions 50 and 52 are p type, and device 2 is in a blocking OFF state. Current from left main electrode 64 to right main electrode 66 is blocked by junction 62. Current flow in the other direction from right main electrode 66 to left main electrode 64 is blocked by junction 60.

Bidirectional FET 2 may be used to control AC power. FIG. 1 schematically shows a load 78 and a source of AC power 80 connected across main electrodes 64 and 66. When right main electrode 66 is positive with respect to left main electrode 64, as driven by AC source 80, the charge on left gate electrode 34 is positive with respect to negative left main electrode 64 connected to source region 42 and p layer region 46. Hence, channel 50 is inverted to n type and conduction occurs, i.e. current flows from positive right main electrode 66 through right source region 44, through right channel 52, through drift region 58 around the bottom 74 of notch 12 in substrate 4, through left channel 50, through left source 42 to negative left main electrode 64 and through load 78.

In the other half cycle of the AC source 80, left main electrode 64 is positive with respect to right main electrode 66, and the charge on right gate electrode 36 is positive with respect to negative right main electrode 66 connected to source 44 and p layer region 48. Conduction is thus enabled through channel 52, and current flows from positive left main electrode 64 through left source 42, through left channel 50, through drift region 58 around the bottom of the notch, through right channel 52, to right source 44 and right negative main electrode 66.

The current path between the main electrodes extends from each source region downwardly through the channel regions and downwardly and around the bottom 74 of the notch. This increases the drift region current path length and affords higher OFF state voltage blocking capability without increasing the lateral dimension along top major surface 6, whereby to afford high density, high voltage bidirectional FET structure with relatively low ON state resistance.

As seen in FIG. 1, a plurality of FETs are afforded in the integrated structure. Top layers 10 and 8 are further split into respective left and right source regions and channel regions by respective notches 14 and 16. Main electrode metalizations are provided comparably to that described, and connected in series in the AC load line, or in parallel as shown in FIG. 1. Respective floating gate electrodes are charged from respective charging electrodes connected in parallel via terminal 68.

Main electrode 66 provides the source electrode for the FET to the left around notch 12, and also provides the source electrode for the FET to the right around notch 14. Main electrode 82 provides the drain electrode for the FET around notch 14, and also provides the drain electrode for the FET around notch 16. In the other half cycle of AC source 80, the roles of electrodes 66 and 82 are reversed, i.e. electrode 66 is the drain for its left and right FETs around respective notches 12 and 14, and electrode 82 is the source for its left and right FETs around respective notches 14 and 16. Alternate main electrodes 64, 82 and so on, are thus connected to one side of the AC source, and the other alternate main electrodes 66, 84 and so on, are connected to the other side of the AC source.

Figure 2:
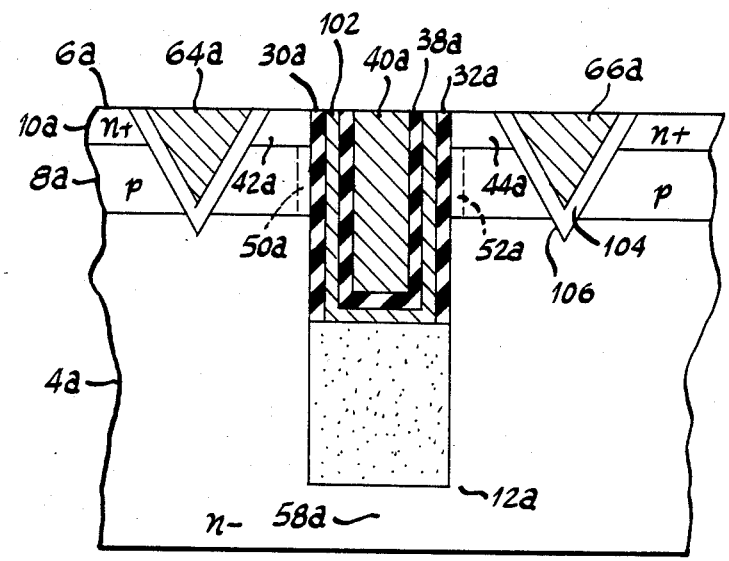
FIG. 2 is a schematic sectional view of an alternate embodiment of FIG. 1.

There are numerous alternative structures to that in FIG. 1. While a split gate structure is preferred affording a separate gate electrode for each channel, a single gate electrode 102 may be used, as shown in FIG. 2, where like reference numerals as FIG. 1 are used with postscripts "a" where appropriate to facilitate clarity. In another alternative, FIG. 2, main electrode 66a may extend downwardly through the top n+ layer and also through the top p layer into substrate 4a, and include a p+ layer 104 therealong forming a junction 106 with substrate 4a.

Figure 3:
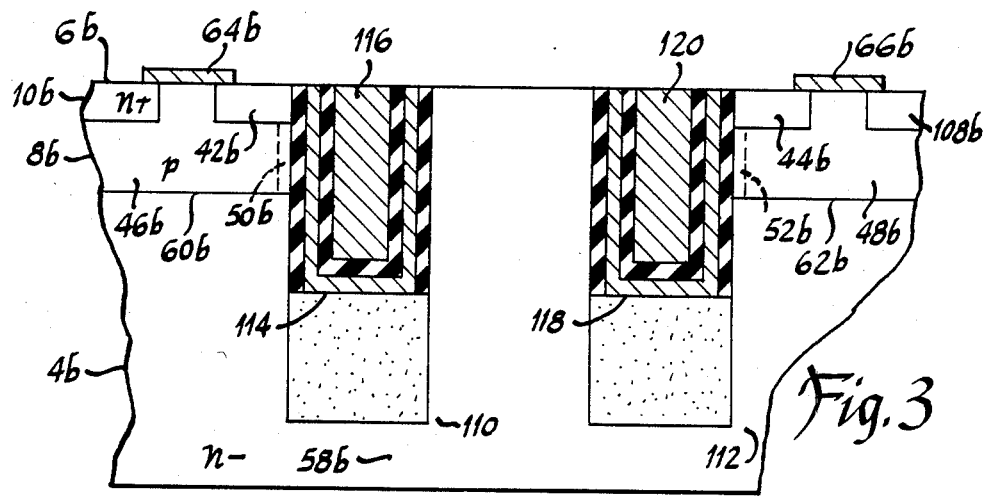
FIG. 3 is a schematic sectional view of another alternate embodiment.

In another alternative, as shown in FIG. 3 using like reference numerals as FIG. 1 with the postscript "b" where appropriate to facilitate clarity, instead of each main electrode such as 66 extending downwardly from top major surface 6, main electrode 66b may be disposed on top of surface 6b and contact spaced n+ diffused tub regions 44b and 108b corresponding to regions 44 and 108 of FIG. 1. In a further alternative, FIG. 3, the notch means may be provided by two notches 110 and 112, each notch having gate electrode and charging electrode structure like that shown in FIG. 2. Left gate electrode 114 is charged from left charging electrode 116, and right gate electrode 118 is charged from charging electrode 120 which may be connected to charging electrode 116 or supplied separately. The current path through drift region 58b extends around the bottoms of both notches 110 and 112 between channels 50b and 52b.

Figure 4:
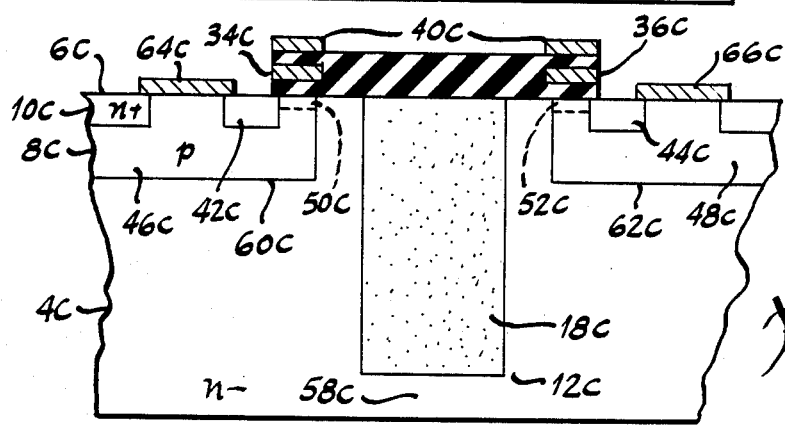
FIG. 4 is a schematic sectional view of yet another alternate embodiment.

In another alternative, as shown in FIG. 4 using like reference numerals as FIG. 1 with the postscript "c" where appropriate to facilitate clarity, lateral channels 50c and 52c are provided instead of the vertical channels 50 and 52. For each of the lateral and vertical channel embodiments, the insulative regions such as 18c may be eliminated. For lateral channel versions, such as FIG. 4, the notches such as 12 may be eliminated. If notch means is used in a lateral channel version with vertical gate electrodes, the gate electrodes also include portions extending horizontally along top major surface 6c insulated above channels 50c and 52c. Split gate electrode means is preferred, though a single gate may be used extending across both channels, either with a notch and having vertical channels, or without a notch and having horizontal channels. It is recognized that various modifications are possible within the scope of the appended claims.

We claim:

1. A bidirectional power FET, comprising:
   a first source region of one conductivity type semiconductor material;
   a first channel region of opposite conductivity type semiconductor material forming a junction with said first source region;
   a single drift region of said one conductivity type semiconductor material forming another junction with said first channel region;
   a second channel region of said opposite conductivity type semiconductor material forming a junction with said drift region;
   a second source region of said one conductivity type semiconductor material forming a junction with said second channel region;
   gating means including gate electrode means disposed proximate said first and second channel regions and adapted for storing trapped charge for producing electric fields of sufficient intensity to invert the conductivity type in said first and second channel regions;
   whereby upon application of voltage of either polarity to said first and second source regions, electric current can flow in a respective corresponding direction between them, under control of said gating means;
   said single drift region supporting OFF state blocking voltage in both directions.

2. The invention according to claim 1 wherein said gating means includes charging electrode means disposed proximate said gate electrode means for charging the latter.

3. The invention according to claim 2 comprising electrical insulation layer means between said gate electrode means and said first and second channel regions, and electrical insulation layer means between said charging electrode means and said gate electrode means, the latter being charged by carriers tunneling through said last mentioned insulation layer means in response to given polarity potential on said charging electrode means.

4. The invention according to claim 3 wherein said FET has an OFF state in the absence of said trapped charge on said gate electrode means, with the junction between said drift region and one of said channel regions blocking current flow toward one of said source regions, and with the junction between said drift region and the other of said channel regions blocking current flow toward the other of said source regions, said trapped charge being depleted from said gate electrode means by tunneling through said last mentioned insulation layer means in response to opposite polarity potential on said charging electrode means.

5. The invention according to claim 4 wherein said gate electrode means floats in both the ON and OFF states of said FET.

6. The invention according to claim 4 comprising a pair of main electrodes each connected to a respective said source region and channel region, said main electrodes being connectable to an AC load line, such that said trapped charge on said gate electrode means renders the latter positive with respect to the first of said main electrodes during the first half cycle of said AC line, and positive with respect to the second of said main electrodes during the second half cycle of said AC line, such that during the first half cycle of said AC line, current flows from said second main electrode through said second source region, through said second channel region, through said drift region, through said first channel region, through said first source region to said first main electrode, and such that during the second half cycle of said AC line, current flows from said first main electrode through said first source region, through said first channel region, through said drift region, through said second channel region, through said second source region to said second main electrode.

7. The invention according to claim 6 wherein:
   during said first half cycle of said AC line, current flows from said second main electrode momentarily across a forward biased junction between said second channel region and said drift region, and then flows through said first channel region to said first source region and said first main electrode, the falling potential in said substrate across said forward biased junction relative to said gate electrode means causing said gate electrode means to attract given polarity carriers to said second channel region to invert the latter to said one conductivity type, such that the main current path during said first half cycle is from said second main electrode through said second source region, through said second channel region, through said drift region, through said first channel region, through said first source region to said first main electrode; and such that during the second half cycle of said AC line, current flows from said first main electrode momentarily across a forward biased junction between said first channel region and said drift region and then flows through said second channel region, to said second source region and said second main electrode, the falling potential in said substrate across said last mentioned forward biased junction relative to said gate electrode means causing said gate electrode means to attract given polarity carriers to said first channel region to invert the latter to said one conductivity type, such that the main current path during said second half cycle is from said first main electrode through said first source region, through said first channel region, through said drift region, through said second channel region, through said second source region to said second main electrode.

8. The invention according to claim 4 wherein said gate electrode means comprises split gate electrode means comprising a first gate electrode disposed proximate said first channel region and a second gate electrode disposed proximate said second channel region.

9. The invention according to claim 4 comprising notch means extending between and separating said first and second source regions and said first and second channel regions, and extending into said drift region.

10. The invention according to claim 9 wherein said channel regions are laterally spaced by said notch means, and said notch means extend downwardly from a top major surface of said FET, said drift region extending around the bottom of said notch means, wherein said notch means extends downwardly into said drift region a substantial distance below said gate electrode means to substantially diminish attraction of carriers by said gate electrode means from said drift region toward the edges of said notch means, to prevent unwanted inducement of conduction channels in said OFF state and afford higher OFF state voltage blocking capability.

11. The invention according to claim 10 wherein said channel regions extend generally vertically along respective sides of said notch means, said drift region being below said channel regions, wherein the portion of said notch means below said gate electrode means comprises anodized single crystalline porous silicon oxidized to a substantially insulative condition.

12. The invention according to claim 11 wherein said source regions are laterally spaced along said top major surface by said notch means therebetween, said source regions being above respective said channel regions.

13. The invention according to claim 12 wherein said gate electrode means comprises split first and second gate electrodes extending vertically within said notch means along opposing sides thereof adjacent and insulated from respective said first and second channel regions, and said charging electrode means extends generally vertically within said notch means insulated between said first and second gate electrodes, and said charging electrode means extends downwardly to about the depth of the lowermost extent of said first and second gate electrodes.

14. The invention according to claim 10 wherein said notch means comprises first and second spaced notches extending between said first and second source regions and said first and second channel regions, said gate electrode means comprises split first and second gate electrodes, said first gate electrode being in said first notch and including a portion proximate said first channel region, said second gate electrode being in said second notch and including a portion proximate said second channel region, said charging electrode means comprising a first charging electrode in said first notch insulated from said first gate electrode, and a second charging electrode in said second notch insulated from said second gate electrode.

15. The invention according to claim 4 wherein said channel regions extend horizontally along a top major surface between a respective said source region and said drift region, said gate electrode means extends horizontally along said top major surface above said channel regions, and said charging electrode means extend horizontally along said top major surface above said gate electrode means.

16. The invention according to claim 15 wherein said gate electrode means comprises split gate electrode means comprising a first gate electrode overlying said first channel region and underlying said charging electrode means, and a second gate electrode overlying said second channel region and underlying said charging electrode means.

17. The invention according to claim 4 wherein said gate electrode means comprises a single gate electrode disposed proximate said first and second channel regions.

18. The invention according to claim 17 comprising notch means extending between and separating said first and second source regions and said first and second channel regions, and extending into said drift region, said channel regions being laterally spaced by said notch means, said notch means extending downwardly from said top major surface of said FET.

19. The invention according to claim 18 wherein said channel regions extend generally vertically along respective sides of said notch means, said drift region being below said channel regions, said source regions being laterally spaced along said top major surface by said notch means therebetween, said source regions being above respective said channel regions, said single gate electrode means including portions extending generally vertically along opposing sides of said notch means adjacent to and insulated from respective said channel regions, said charging gate electrode means extending generally vertically within said notch means between said opposing portions of said gate electrode means and insulated from said gate electrode means, wherein said notch means extends downwardly into said drift region a substantial distance below said gate electrode means to substantially diminish attraction of carriers by said gate electrode means from said drift region toward the edges of said notch means, to prevent unwanted inducement of conduction channels in said OFF state and afford higher OFF state voltage blocking capability.

20. The invention according to claim 18 wherein said channel regions extend horizontally along a top major surface between a respective said source region and said drift region, said single gate electrode means extending horizontally along said top major surface and overlying said notch means and both said channel regions, said charging gate electrode means extending horizontally along said top major surface and insulated above said single gate electrode means.

* * * * *